(12) United States Patent
Bolda

(10) Patent No.: US 6,417,701 B1
(45) Date of Patent: Jul. 9, 2002

(54) METHOD AND APPARATUS FOR IDENTIFYING A WAVEFORM PERIOD

(75) Inventor: Daniel J. Bolda, New Berlin, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 09/675,243

(22) Filed: Sep. 29, 2000

(51) Int. Cl.[7] .............................................. H03K 5/153
(52) U.S. Cl. ......................................... 327/79; 327/333
(58) Field of Search ............................. 327/39, 40, 41, 327/44, 46, 47, 78–80, 122, 125, 133–135, 333, 347, 349

(56) References Cited

U.S. PATENT DOCUMENTS 4,218,627 A * 8/1980 Kiesel ........................... 325/21
4,360,783 A * 11/1982 Nagasawa et al. ........... 323/242
5,896,056 A * 4/1999 Glucina ........................ 327/348
6,198,258 B1 * 3/2001 Ando et al. .................. 323/222

* cited by examiner

*Primary Examiner*—My-Trang Nu Ton
(74) *Attorney, Agent, or Firm*—Patrick S. Yoder; Alexander M. Gerasimow; William R. Walbrun

(57) ABSTRACT

A technique is provided for identifying waveform period or specific events during a waveform period. A periodic waveform is an input signal for a comparator, voltage divider and a balanced load. The circuitry produces a square waveform that has the same period as the input waveform, but is phase shifted based upon time required for the input waveform to cross positive and negative offsets from a zero axis. The resulting timing signals may be used for analysis of the input waveform, such as for RMS calculations based upon sampling of the input waveform.

36 Claims, 3 Drawing Sheets

METHOD AND APPARATUS FOR IDENTIFYING A WAVEFORM PERIOD

BACKGROUND OF THE INVENTION

1. Field Of The Invention

The present invention relates generally to identifying the period of a waveform. More particularly, the present invention relates to a method and apparatus for identifying the period of an AC waveform to provide information, such as to an electrical to a relay, which may be used in monitoring or control functions, such as to provide protection from phase loss, ground fault, and overcurrent conditions.

2. Description Of The Related Art

Many applications require analysis of AC waveforms. For example, it is often desirable to know the exact root-mean-squared (RMS) content of a signal, such as AC power. This can be accomplished by means of a hardware or software calculation method. For software calculation algorithms to function correctly, a timing signal is usually needed to tell the software when to start calculating the RMS content of a sampled waveform, and when to stop. This timing signal may take the form of a square wave with edges corresponding to zero crossings of the sampled signal, and having the same frequency as the sampled signal. Thus, the zero crossings will indicate the period of a particular waveform being sampled.

In such applications, inaccuracies in timing signals may result in corresponding errors in any analysis done on waveforms sampled based upon the timing signals. For example, the timing signal may be out of phase with or have a different period from the sampled waveform. By calculating RMS values for a sampled waveform in which the period is inexact, the RMS values calculated by a system may be inaccurate. This becomes particularly significant when the RMS values are being used in a system for circuit protection or monitoring, such as provide protection from phase loss, ground fault, and overcurrent conditions. What is needed is a way of identifying an accurate period of a sampled waveform to be used in RMS calculations.

Circuits have been developed for creating timing signals, such as for RMS analysis of waveforms, based upon zero crossings of the waveform. Because between zero crossings of an alternating current waveform, the period may be assumed to be captured (from a first to a third zero crossing), zero crossings normally provide an adequate mechanism for identifying the waveform. However, depending upon the amplitude of the waveform, the point at which the zero crossing actually takes place may be difficult to discern. This is particularly true where large variations in amplitude may take place within specific circuitry. Where the amplitude is large, zero crossings may be clearly identified. However, where the amplitude becomes smaller, the waveform approaches the zero crossing from a more shallow angle, when considered graphically, making identification of the zero crossing difficult. If highly accurate analysis of the waveform parameters is needed, then, the timing signal based upon zero crossing may not be sufficiently accurate to ensure the desired degree of reliability.

There is a need, therefore, for an improved technique for identifying waveform periods. There is a particular need for a technique capable of reliably identifying waveform periods, or at least repeatable events in waveforms, so as to permit analysis to be performed based upon accurate timing signals through a range of amplitudes of the waveforms.

SUMMARY OF THE INVENTION

The present invention provides a technique for identifying a waveform period designed to respond to these needs. The technique may be used with a variety of waveform profiles, but is particularly well suited to AC waveforms, such as voltage or current waveforms of AC power. The technique may also be used in a wide variety of devices and settings. However, the technique is particularly well suited to monitoring and control equipment, such as circuit protection devices wherein RMS calculations are made based upon sampling of AC waveforms. Other settings might include power monitors, control devices, power generation devices, and so forth.

The technique permits identification of waveform period over a range of amplitudes by providing a mechanism for identifying an event in a waveform other than a zero crossing. In particular, the technique identifies points at which a waveform crosses a level offset from a zero axis. By detecting the event offset from the zero axis, the timing signals produced by the circuitry are more immune to noise which is particularly elevated in comparison to lower amplitudes which the waveform may assume.

BRIEF DESCRIPTION OF THE DRAWINGS

The foregoing and other advantages of the invention will become apparent upon reading the following detailed description and upon reference to the drawings in which like reference numerals denote like elements, and in which.

DETAILED DESCRIPTION OF SPECIFIC EMBODIMENTS

Figure 1:
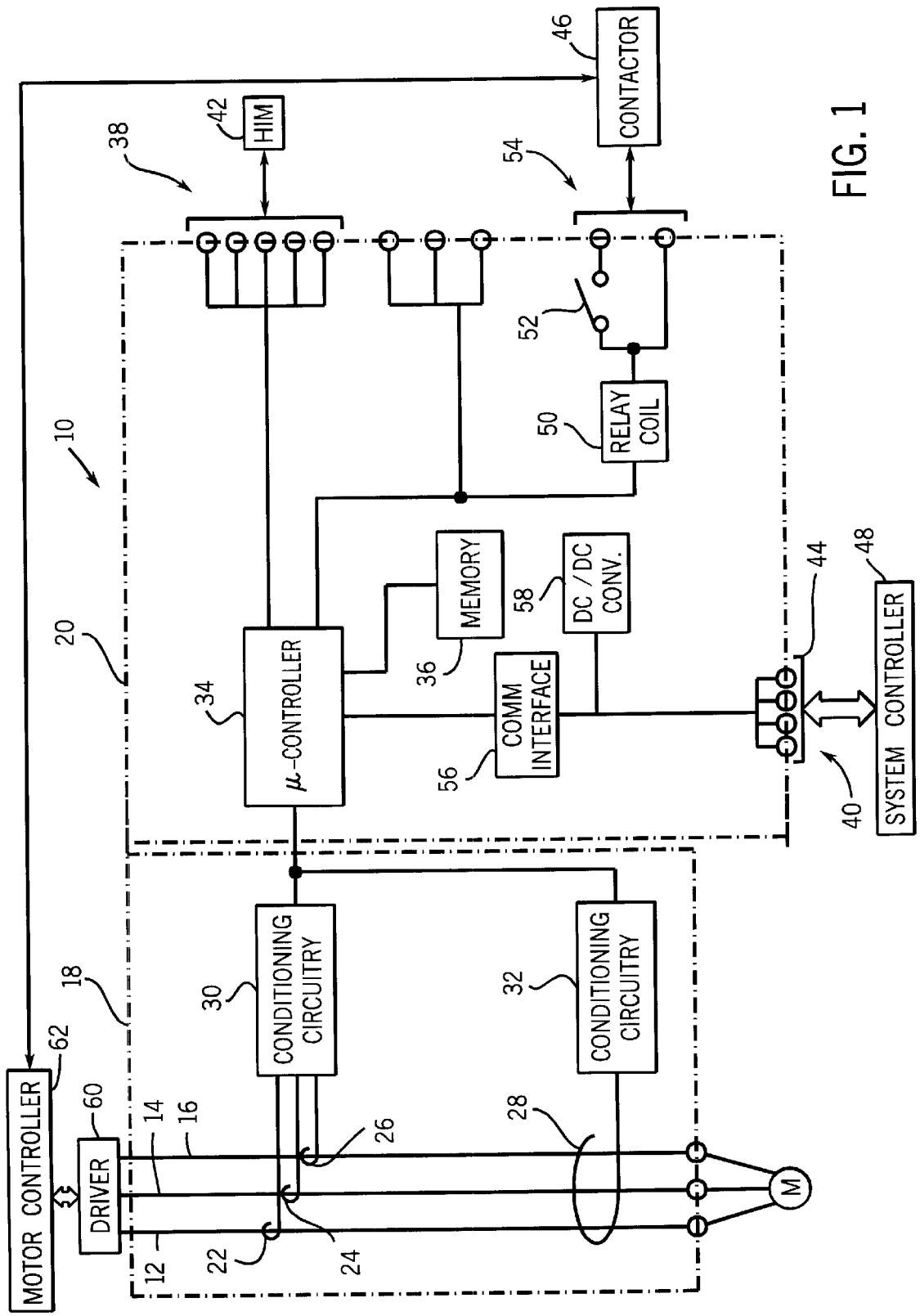
FIG. 1 is a diagrammatical illustration of a typical three-phase overload detection system as an exemplary application for the present technique, and employing circuitry for identification of waveform periods.

Turning now to the drawings, and referring first to FIG. 1, the present technique is described as it might be implemented in an exemplary device, such as an overload relay. A typical overload relay 10 for monitoring and interrupting current flow provided to a motor via power conductors 12, 14, and 16 is illustrated. Relay 10 includes a sensing module 18 and a control module 20. Sensing module 18 includes sensors 22, 24, 26, and 28, which are arranged to monitor the current flow through power conductors 12, 14, and 16. Sensors 22–28 may be Hall effect sensors or current transformers having a core through which power conductors 12, 14 and 16 extend. Sensors 22, 24 and 26 are configured to monitor the current flow in each power conductor 12, 14 and 16, respectively, and to provide output signals representative of the individual phase currents, L1, L2 and L3. Sensor 28 is configured to simultaneously monitor the current flow in all three power conductors and to provide an output signal representative of a vector sum of the phase currents. This vector sum is also known as the ground fault current.

Three-phase solid-state relays typically detect the occurrence of a ground fault in a three-phase system by monitoring or determining the vector sum of the currents in each phase. Normal operation is indicated when the phase currents substantially cancel one another, and a ground fault is indicated if the vector sum of the phase currents exceeds a predetermined trip threshold value. In alternative configurations and devices, sensors 22–28 can be any type of sensor or sensing circuit for measuring or comparing current in power conductors. The output signals from sensors 22–28 are provided to conditioning circuitry 30 and 32, which are configured to appropriately condition (e.g., filter, amplify, rectify, convert, etc.) the sensor output signals for compatibility with the control circuitry in control module 20.

Control module 20 includes a microprocessor-based controller 34 which is configured to execute a variety of processing and control functions in accordance with a program stored in a memory 36 and based on input data received via any of a series of inputs 38 and 40 and from sensing module 18. Inputs 38 may be terminals or input ports (wired or wireless) which allow data input from a compatible external source, such as a human interface module (HIM) 42, etc. Inputs 40 may be terminals or pins of a modular connector 44 which connects overload relay 10 to a network and to other networked data sources or controllers.

Referring still to FIG. 1, based on the sensor output signals received from sensing module 18, controller 34 executes the processing and control routines defined by the program stored in memory 36 to react to parameters associated with the monitored currents. Such parameters are related to the reporting functions and fault protection functions of the device and may include, for example, average current, current imbalance, a vector sum of currents, occurrence of a fault condition, and so forth. Controller 34 is further configured to generate an output signal or output data based on the parameters. For example, controller 34 may provide a status signal indicative of the occurrence of a fault condition, a trip signal to interrupt current flow through the power conductors, or a reporting signal representative of such monitored parameters as average current, phase current, current imbalance, or ground fault current. The output signal or data may be provided to external standalone devices (e.g., a contactor 46, HIM 42, system controller 48) and/or to other networked devices.

In the embodiment illustrated, controller 34 is configured to energize a relay coil 50 of a sub-miniature relay upon detection of a fault condition associated with the current flow through the power conductors (e.g., ground fault, phase loss, or overcurrent). Energization of coil 50 opens a relay switch 52, thus providing a trip signal at outputs 54 to cause interruption of current flow through the power conductors 12, 14 and 16. For example, outputs 54 may be appropriately connected such that relay switch 52 is in series with an external power supply and an energization coil of three-phase contactor 46. When relay switch 52 opens in response to indication of a fault condition, the energization coil of contactor 46 is de-energized and the contacts of the contactor open, interrupting current flow through the power conductors. Controller 34 also may be configured to energize coil 50 in response to signals received from networked sources via inputs 40 or from non-networked sources via input terminals 38.

As mentioned above, overload relay 10 can be configured to exchange data with other networked devices or controllers via inputs 40. Data exchange between relay 10 and other networked devices passes through a communication interface 56 of control module 20. Communication interface 56 formats the data in an appropriate manner for exchange between controller 34 and other networked devices.

In the embodiment illustrated in FIG. 1, relay 10 receives power from an external networked source to provide energy for its electronic devices. The power is appropriately conditioned by a DC/DC converter 58. For example, DC/DC converter 58 may convert 24 VDC received from the network to 5VDC, which is a level that is compatible with the internal electronic components of the device. System controller 48 may provide for overall control of the motor system. Further, the motor M may be driven by a variable frequency driver 60. The variable frequency driver 60 may be configured to allow the motor to operate in a frequency range of 20 Hz–250 Hz. The motor speed provided by the driver 60 may be selected and controlled by a motor controller 62. The variable nature of the frequency and the wide frequency range may provide challenges in monitoring and measuring the applied waveform parameters, which are overcome by the present technique, as will be discussed herein. It should be noted that the controller 62 and driver 60 are illustrated as one exemplary application only. Again, however, the present technique may be used with a wide variety of other equipment and circuitry.

Controller 34 will process the information received from the conditioning circuitry 30 and 32 to determine if an unwanted condition exists. To determine whether an unwanted condition exists, the controller 34 in the present embodiment will calculate RMS values for the currents provided by the conditioning circuitry 30 and 32. Generally, an RMS value is. calculated by taking the square root of the sum of the squared samples divided by the number of samples. That is:

$$X_{rms} = [\text{"sum\_of\_the\_squared\_samples"}/\text{"number\_of\_samples"}]^{1/2} = [(x^2_1 + x^2_2 + \ldots + x^2_n)/N]^{1/2}$$

In one embodiment of the present invention, x represents current (measured directly or indirectly). Thus, the RMS currents measured via sensors 22–26 are calculated according to the formula above. However, in alternate embodiments or applications, other RMS values (e.g. power, voltage) may be used. The currents measured through sensors 22–26 will be referred to as L1, L2, and L3.

It should be noted that, while the present technique is described herein as applied in a protective relay and for the purpose of calculating RMS values in such a relay, more generally, the technique may be applied in other settings and applications. In general, the technique permits the period of a waveform, or desired events in a waveform, to be identified as set forth below. The technique is particularly well suited to applications in which frequencies and amplitudes of waveforms vary, and at least at certain amplitudes noise may become problematic as compared to the amplitude of the waveform. Again, however, the technique is equally well suited to a variety of waveform types and profiles, and may generally replace circuits in which timing signals are generated based upon zero crossings in heretofore known devices.

As previously discussed, in the exemplary embodiment illustrated, to calculate an RMS value used to provide protection from phase loss, ground fault, and overcurrent conditions, it is necessary to determine the period of the waveform. One means of determining the period of a sample waveform is to detect the zero crossings. Prior art methods of determining the zero crossings of a waveform often led to inaccuracies, particularly when the amplitude of the waveform is low compared to possible noise levels. This is undesirable in that it provides inaccurate RMS values, as well as inaccuracies in any other analyses performed based upon the detected period. The present invention offers a repeatable and predictable phase delay such that the delay of a timing signal that is developed as the sampled waveform increases through it period is approximately equal to the timing edge delay that is developed as the sampled waveform decreases through its period. In other words, the technique matches any offset which may be introduced in timing signals and reproduces it in subsequent timing signals to insure that a full waveform period is accurately sampled. The offset also provides a buffer to minimize the chance of a false zero crossing being detected.

Figure 2:
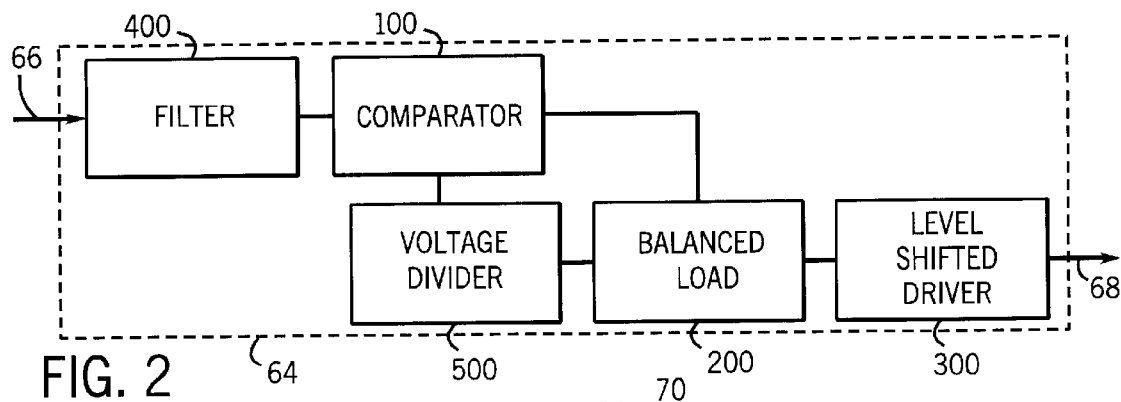
FIG. 2 is a block diagram of a waveform period identification circuit in accordance with aspects of the present technique.

FIG. 2 is a block diagram illustrating one embodiment of the present period detection circuitry. The period detection circuit 64 comprises a comparator 100, a balanced load 200, and a level shifted driver 300. A filter 400 may be connected between an input 66 to which the waveform is applied and the comparator 100 to reduce error voltages and provide low pass filtering of the input waveform. A voltage divider 500 may be connected between the comparator 100 and the balanced load 200. The period detection circuit 64 produces an output signal 68 as described below.

Figure 3:
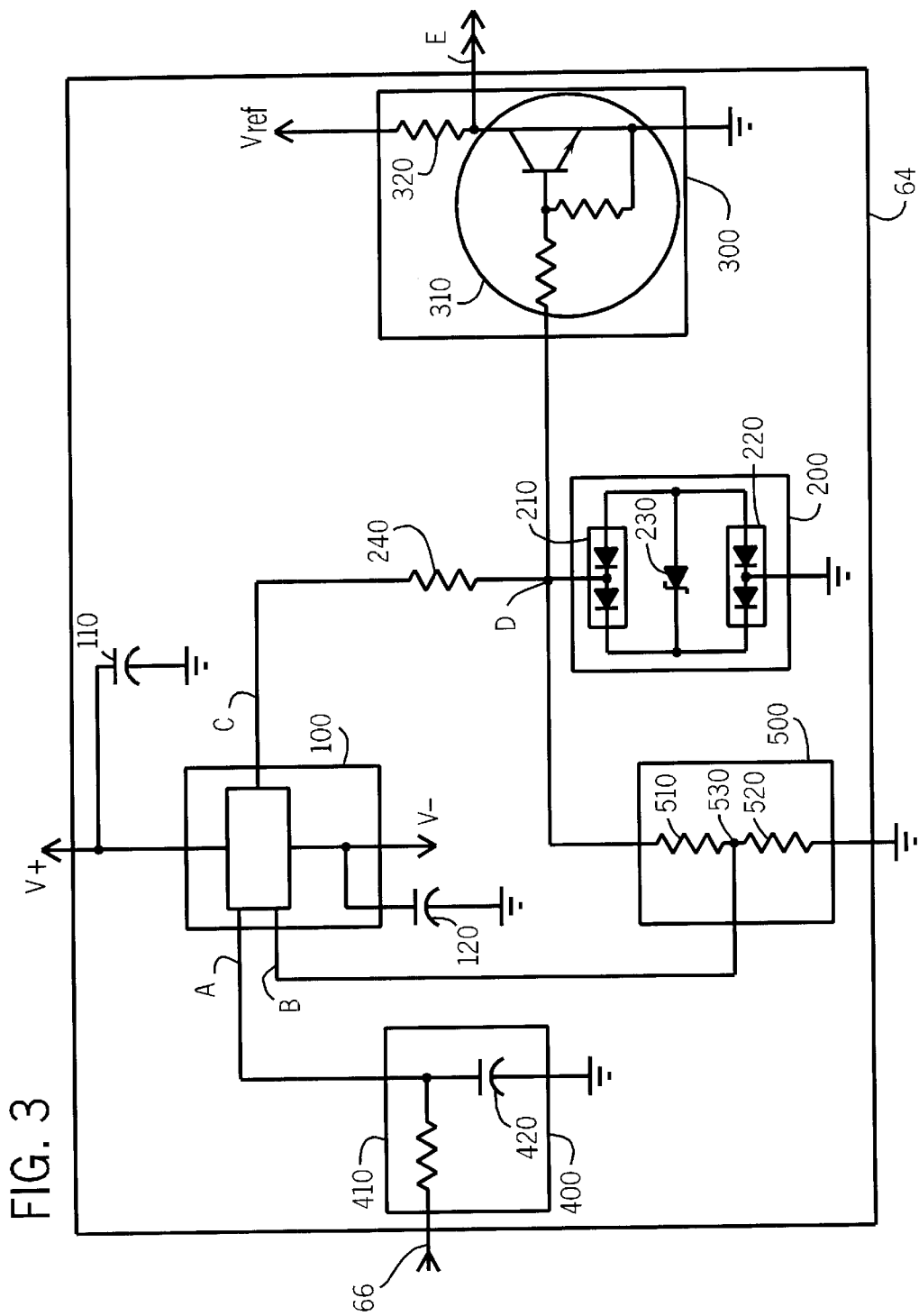
FIG. 3 is a schematic diagram of an exemplary circuitry illustrated in FIG. 2.

FIG. 3 illustrates a schematic drawing of the period detection circuit 64 illustrated in FIG. 2. The balanced load 200 is comprised of a high side dual diode 210, a low side dual diode 220 and a Zener diode 230. A load limiting impedance such as a resistor 240 limits the current through the diodes in the balanced load 200, setting the value of the voltage across the balanced load 200.

When the comparator 100 sources current, current flows from the output of the comparator 100 through resistor 240, through the forward-biased diode in the high side dual diode 210, through the Zener diode 230, and through the forward-biased diode in the low side dual diode 220, finally reaching the circuit ground. When the comparator 100 sinks current, current flows from the circuit ground, through the forward-biased diode in the low side dual diode 220, through the Zener diode 230, through the forward-biased diode in the high side dual diode 210, through the resistor 240, and finally into the output of the comparator 100.

Regardless of whether the comparator 100 output sinks or sources current, the absolute value of the voltage across the balanced load 200 is approximately equal or balanced. This balancing is accomplished because the diodes within the dual diode packages 210 and 220 will have identical V-I forward biasing characteristics. That is, regardless of whether the output of the comparator 100 is sinking or sourcing current, current always flows through one of the high side dual diodes 210, one of the low side dual diodes 220, and the Zener diode 230 from cathode to anode. The comparator 100 will also be coupled to positive and negative voltage sources, V+ and V−, which may be, for instance +12V and −12V. The positive and negative voltage sources, V+ and V−, may further be coupled to capacitors 110 and 120 to stabilize the comparator 100. In an alternate embodiment, the balanced load 200 could be replaced by a full wave bridge rectifier having four identically matched diodes. However, this embodiment may entail a higher cost and lead to limited part availability.

The balanced load 200 is used to provide hysteretic positive feedback via voltage divider 500. Voltage divider 500 is comprised of two resistors 510 and 520. The voltage value at the hysteresis set point 530 is equal to the voltage across the balanced load 200 multiplied by the value of the voltage divider 500. The voltage divider 500 is coupled to one of the inputs of the comparator 100. The other input of the comparator 100 is coupled to the filter 400. The filter 400 is comprised of resister 410 and capacitor 420. In the exemplary embodiment, the input signal 66 is a sine wave produced by the conditioning circuitry 30 (see FIG. 1). By way of example, the input 66 may be a sinusoidal current waveform. Thus, the second input to the comparator 100 will be a sine wave representing current L1, L2, or L3. If the absolute value of the sine wave input signal 66 exceeds the absolute value of the hysteresis set point 530, the comparator 100 will oscillate, or alternate sinking and sourcing current into the balanced load 200. Since the hysteresis set point 530 is based upon the voltage across the balanced load 200, the absolute value of the hysteresis set point 530 when the input signal 66 is positive is equal to the hysteresis set point 530 when the input signal 66 is negative. This will produce a square wave at the input of the balanced load 200 that oscillates between a positive balanced load voltage and a negative balanced load voltage.

The level shifted drive 300 takes the square wave voltage across the balanced load 200 and converts it to a solely positive waveform with the same frequency as the input waveform 66 and with edges in phase with the input waveform 66. This is accomplished by using a driver transistor 310 that can tolerate an emitter-base voltage equal to the absolute value of the voltage across the balanced load 200. In this condition, the driver will remain in cutoff mode, providing a logic HIGH signal through resistor 320. When the balanced load 200 reverses voltage, the base-emitter is forward-biased, providing a logic LOW signal through the driver transistors 310 collector-emitter junction. This signal, having a digital format, can be used by the controller 34 for analysis purposes, such as to compute RMS contents of the input waveform.

In one embodiment of the present invention, the following components may have models or ratings as follows:

| Ref. Number | Component |
| --- | --- |
| 100 | TLE2022ID |
| 110 | 0.01 μF |
| 120 | 0.01 μF |
| 210 | MMBD7000L |
| 220 | MMBD7000L |
| 230 | 2.7 V |
| 240 | 7.87 KΩ |
| 310 | UMH9N |
| 320 | 10 KΩ |
| 410 | 1 KΩ |
| 420 | 0.047 μF |

Figure 4:
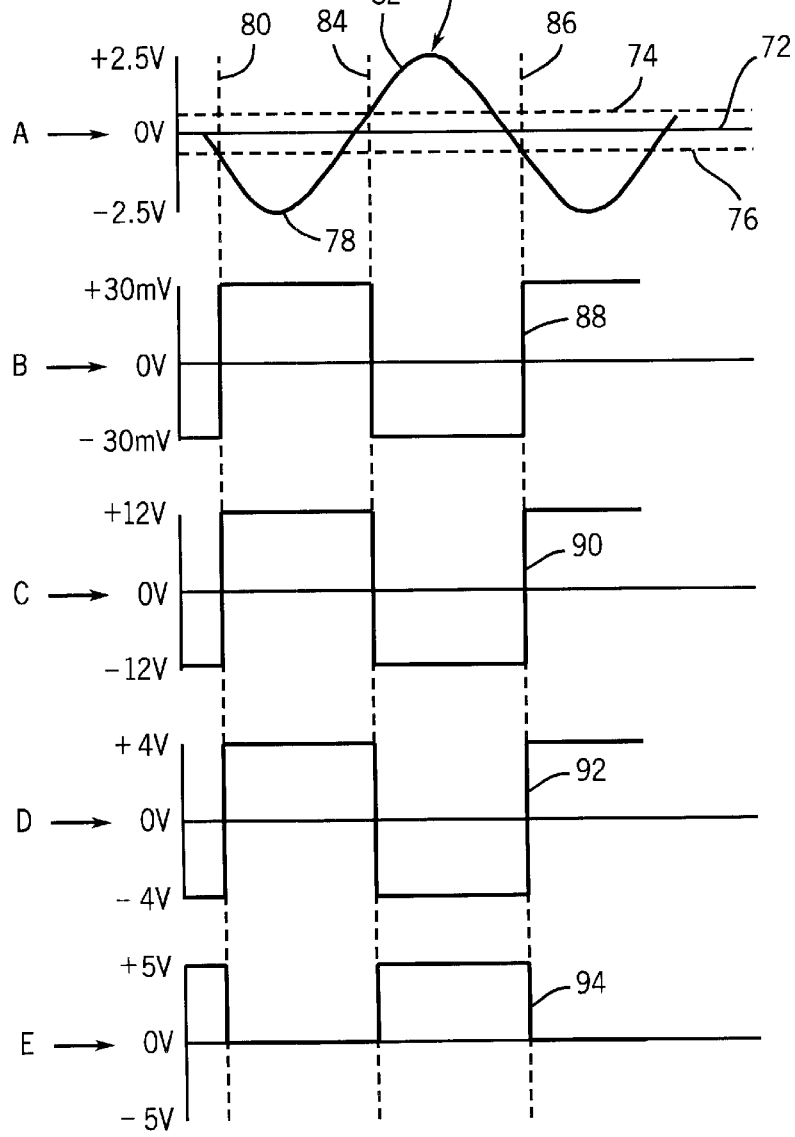
FIG. 4 is a series of graphs of voltage waveforms at different points within the circuit of FIG. 3.

FIG. 4 illustrates voltage waveforms taken at various points within the period detection circuit 64 shown in FIG. 3. Trace A is shows a sinusoidal voltage waveform 70 at an input point A to comparator 100 from filter 400. The waveform varies in amplitude about a zero axis 72. Offsets 74 and 76 are illustrated about the zero axis as established by the period detection circuitry described above. The circuitry effectively detects when a negative-going portion 78 of the waveform first crosses the negative offset 76, at a time identified by reference numeral 80 in FIG. 4. The circuitry then detects when a positive-going portion 82 of the waveform first crosses the positive side offset 74, at a time identified by reference numeral 84. The operation in this manner continues with subsequent crossings of the offsets, as indicated at reference numeral 86.

The operation of the balanced load 200 and voltage divider 500 provide square waves having leading and trailing edges corresponding in time to the times at which the waveform 70 crosses the offsets 74 and 76. Trace B shows the low level voltage square wave 88 produced at input B to the comparator 100, while trace C shows the output waveform 90 from the comparator. Trace D shows a similar square waveform 92 produced at node D in FIG. 3. Finally, to accommodate the requirements of the microprocessor used in the exemplary embodiment described, driver circuit 300 outputs a corresponding square waveform 94 shifted to positive and zero levels. In all cases, the output waveforms, however, correspond to specific events in the original input waveform (i.e., the crossing of the offsets in the illustrated embodiment), and are of the same period as the input waveform.

It should further be understood that the specific embodiments shown and described herein are by way of example only, and the invention may be susceptible to various modifications and alternative forms. Accordingly, the invention is not intended to be, and should not be construed as, limited to the particular forms disclosed. Rather, the invention is to cover all modifications, equivalents, and alternatives falling within the spirit and scope of the invention as defined by the following appended claims.

What is claimed is:

1. A circuit for identifying the period of a waveform, comprising:
    a comparator comprising a first input, a second input and an output;
    a balanced load circuit coupled to the output of the comparator and configured to provide feedback to the second input of the comparator; and
    a level shifted driver circuit coupled to the balance load circuit, the driver circuit comprising a driver transistor which is configured to convert the output of the balanced load to a positive logic signal, the level shifted driver circuit being configured to provide the logic signal with a desired offset, the offset corresponding to a waveform received at the second input of the comparator.

2. The circuit set forth in claim 1, wherein the circuit further comprises:
    a filter coupled to the first input of the comparator; and
    a voltage divider positioned between the balanced load and the second input of the comparator.

3. The circuit set forth in claim 1, wherein the first input of the comparator is configured to receive a periodic waveform.

4. The circuit set forth in claim 3, wherein the second input of the comparator is configured to receive a square waveform.

5. The circuit set forth in claim 4, wherein the output of the comparator is a square waveform comprising transition edges which occur at a desired offset.

6. The circuit set forth in claim 1, wherein the comparator is coupled to a positive voltage source and further coupled to a negative voltage source.

7. The circuit set forth in claim 6, wherein the positive voltage source and the negative voltage source are further coupled to stabilizing capacitors.

8. The circuit set forth in claim 1, wherein the balanced load circuit comprises a plurality of diodes.

9. The circuit set forth in claim 8, wherein the balanced load circuit comprises a high side dual diode, a low side dual diode coupled to the high side dual diode, and a Zener diode coupled to the high side dual diode and further coupled to the low side dual diode.

10. The circuit set forth in claim 1, wherein the balanced load circuit comprises a full wave bridge rectifier comprising a plurality of identically matched diodes.

11. The circuit set forth in claim 1, wherein the level shifted driver circuit is configured to tolerate an emitter-base voltage equal to the absolute value of the voltage across the balance load.

12. The circuit set forth in claim 11, wherein the logic signal is a positive signal and wherein the waveform is a square waveform.

13. The circuit set forth in claim 12, wherein the level shifted driver circuit is coupled to a resistor and further coupled to a positive voltage source.

14. A system for identifying the period of a waveform, comprising:
    a sensor;
    a control circuit electrically coupled to the sensor and configured to receive sample data from the sensor and calculate a root-mean-square value for a particular waveform; and
    a circuit electrically coupled to the control circuit to provide the control circuit with zero-crossing data based upon an offset corresponding to a processed waveform derived from the particular waveform.

15. The system set forth in claim 14, wherein the sensor is configured to monitor current flow through a power conductor and provide a sensor output indication representative of the current flow.

16. The system set forth in claim 15, wherein the current flow is produced by a variable frequency driver.

17. The system set forth in claim 16, further comprising a motor coupled to the variable frequency driver.

18. The system set forth in claim 14, wherein the control circuit produces an output signal which may be used to interrupt the current flow through the power conductor when a power conductor fault condition in detected.

19. The system set forth in claim 18, wherein the power conductor fault condition is one of a ground fault condition, a phase loss condition, and an overcurrent condition.

20. The system set forth in claim 14, wherein the circuit providing the control circuit with zero-crossing data comprises:
    a comparator comprising a first input, a second input and an output;
    a balanced load circuit coupled to the output of the comparator and configured to provide a hysteretic positive feedback to the second input of the comparator; and
    a level shifted driver circuit coupled to the balanced load circuit, the driver circuit comprising a driver transistor which is configured to convert the output of the balanced load to a positive logic signal.

21. The circuit set forth in claim 20, wherein the circuit further comprises:
    a filter coupled to the first input of the comparator; and
    a voltage divider positioned between the balanced load and the second input of the comparator.

22. The circuit set forth in claim 20, wherein the first input of the comparator is configured to receive a periodic waveform.

23. The circuit set forth in claim 22, wherein the second input of the comparator is configured to receive a square waveform.

24. The circuit set forth in claim 23, wherein the output of the comparator is a square waveform comprising transition edges which occur at a desired offset.

25. The circuit set forth in claim 20, wherein the comparator is coupled to a positive voltage source and further coupled to a negative voltage source.

26. The circuit set forth in claim 25, wherein the positive voltage source and the negative voltage source are further coupled to stabilizing capacitors.

27. The circuit set forth in claim 20, wherein the balanced load circuit comprises a plurality of diodes.

28. The circuit set forth in claim 27, wherein the balanced load circuit comprises a high side dual diode, a low side dual diode coupled to the high side dual diode, and a Zener diode coupled to the high side dual diode and further coupled to the low side dual diode.

29. The circuit set forth in claim 20, wherein the balanced load circuit comprises a full wave bridge rectifier comprising a plurality of identically matched diodes.

30. The circuit set forth in claim 20, wherein the level shifted driver circuit is configured to tolerate an emitter-base voltage equal to the absolute value of the voltage across the balance load.

31. The circuit set forth in claim 30, wherein the level shifted driver circuit is configured to provide a positive logic signal with a desired offset, the offset corresponding to a square waveform received at the second input of the comparator.

32. The circuit set forth in claim 31, wherein the level shifted driver circuit is coupled to a resistor and further coupled to a positive voltage source.

33. A method for determining the period of a waveform, comprising the acts of:

(a) receiving a periodic waveform;

(b) determining when the signal crosses a positive level offset from a zero level for a parameter of the waveform;

(c) determining when the signal crosses a negative level offset from the zero level for the parameter; and (d) generating an output signal at times corresponding to times at which the signal crossed the positive and negative level offsets.

34. The method set forth in claim 33, wherein the positive level and the negative level offsets are offset an equal amount from the zero level.

35. The method as set forth in claim 33, wherein the output signal is generated only when the signal crosses the positive and negative level offsets for a first time during each period of the waveform.

36. The method as set forth in claim 33, wherein the parameter is voltage.

* * * * *